United States Patent
Leo

(10) Patent No.: US 7,161,292 B2
(45) Date of Patent: Jan. 9, 2007

(54) WHITE LIGHT LED WITH MULTICOLOR LIGHT-EMITTING LAYERS OF MACROSCOPIC STRUCTURE WIDTHS, ARRANGED ON A LIGHT DIFFUSING GLASS

(75) Inventor: Karl Leo, Dresden (DE)

(73) Assignee: Novaled GmbH, Dresden (DE)

( * ) Notice: Subject to any disclaimer, the term of this patent is extended or adjusted under 35 U.S.C. 154(b) by 254 days.

(21) Appl. No.: 10/489,173

(22) PCT Filed: Sep. 13, 2002

(86) PCT No.: PCT/DE02/03426

§ 371 (c)(1),
(2), (4) Date: Aug. 31, 2004

(87) PCT Pub. No.: WO03/026030

PCT Pub. Date: Mar. 27, 2003

(65) Prior Publication Data

US 2005/0017621 A1    Jan. 27, 2005

(30) Foreign Application Priority Data

Sep. 14, 2001   (DE) ................................ 101 45 492

(51) Int. Cl.
*H01J 1/62* (2006.01)
*H01J 63/04* (2006.01)

(52) U.S. Cl. ............... 313/504; 313/506; 313/512; 313/113

(58) Field of Classification Search ........... 313/498, 313/502–504, 506, 512, 113
See application file for complete search history.

(56) References Cited

U.S. PATENT DOCUMENTS

| 5,294,870 A | * | 3/1994 | Tang et al. ............... 313/504 |
| 5,606,462 A | * | 2/1997 | Tsuruoka et al. ......... 359/891 |
| 5,701,055 A | * | 12/1997 | Nagayama et al. ....... 313/504 |
| 6,037,712 A | * | 3/2000 | Codama et al. .......... 313/498 |
| 6,163,038 A | | 12/2000 | Chen et al. .............. 257/103 |

(Continued)

FOREIGN PATENT DOCUMENTS

| DE | 199 16 745 A1 | 10/2000 |
| GB | 2 353 400 A | 2/2001 |
| JP | 2000-098919 | 4/2000 |

(Continued)

OTHER PUBLICATIONS

David G. Lindzey et al., "Pixelated Multicolor Microcavity Displays", IEEE Journal of Selected Topics In Quantum Electronics, vol. 4, No. 1, Jan./Feb. 1998, pp. 113-118.

(Continued)

*Primary Examiner*—Nimeshkumar D. Patel
*Assistant Examiner*—Kevin Quarterman

(57) ABSTRACT

In a white light LED, multicolor-emitting light emitter layers of macroscopic structure widths, whose emission spectra can be mixed to form white light, are arranged laterally next to one another on a first transparent electrode layer. The light emitter layers are preferably in strip form and have, for the purpose of simplifying production, macroscopic dimensions that can be resolved by the eye. The thickness of a light-scattering substrate is chosen such that the radiation beams emitted by the light emitter layers are at least partly superposed on the light exit surface of the light-scattering substrate, thereby creating the optical impression of a white light source.

12 Claims, 1 Drawing Sheet

U.S. PATENT DOCUMENTS

| | | | |
|---|---|---|---|
| 6,181,062 B1 * | 1/2001 | Hiraishi et al. | 313/504 |
| 6,221,563 B1 | 4/2001 | Hryhorenko et al. | 430/315 |
| 6,302,756 B1 * | 10/2001 | Ootsuki et al. | 445/24 |
| 6,542,145 B1 * | 4/2003 | Reisinger et al. | 345/102 |
| 6,633,353 B1 * | 10/2003 | Seki et al. | 349/113 |
| 6,798,469 B1 * | 9/2004 | Kimura | 349/61 |

FOREIGN PATENT DOCUMENTS

| | | |
|---|---|---|
| JP | 2000-231992 | 8/2000 |
| JP | 2000-241811 | 9/2000 |

OTHER PUBLICATIONS

International Preliminary Examination Report of Dec. 3, 2003.

* cited by examiner

US 7,161,292 B2

WHITE LIGHT LED WITH MULTICOLOR LIGHT-EMITTING LAYERS OF MACROSCOPIC STRUCTURE WIDTHS, ARRANGED ON A LIGHT DIFFUSING GLASS

CROSS-REFERENCE TO RELATED APPLICATIONS

This application is an application filed pursuant to 35 U.S.C § 371 of international patent application PCT/DE2002/003426, filed on Sep. 13, 2002, and claiming priority from Application number 10145492.9 filed in the German Patent Office on Sep. 14, 2001, the contents of which are incorporated by reference.

BACKGROUND OF THE INVENTION

1. Field of the Invention

The present invention is generally concerned with the field of electroluminescent light emission devices and relates, in particular, to an electroluminescent light emission device according to the preamble of patent claim 1, which can be used as a white light source.

2. Description of the Related Art

In the past, various concepts have been developed in the endeavor to replace conventional white light sources based on incandescent or halogen lamps.

The furthest advanced concept is based on a semiconductor LED based on GaN or InGaN, which is at least partly embedded in a transparent casting resin material containing a converter substance for an at least partial wavelength conversion of the light emitted by the LED. In this case, the LED preferably has a plurality of light-emitting zones which generate a relatively broadband light emission spectrum above the emission spectrum of the converter substance in energy terms. The light in the blue or UV wavelength range emitted by the GaN-LED is at least partly converted by the converter substance into light having a wavelength in the yellow spectral range upon passing through the casting resin composition, so that white light is generated by additive color mixing. On the basis of this concept, small-format luminous sources such as torches and the like have recently been introduced commercially. However, these products still have various disadvantages. First of all, the spectral light emission curve of these white light sources is still not optimal, so that the physiological-optical impression of a white light source is in many cases not provided—at least not from all viewing angles. Furthermore, the luminous intensity of the white light sources which can be produced according to this concept is limited on account of the still excessively low light power of the GaN-LEDs and the necessary light conversion. Therefore, large-area white light sources having a high luminous intensity are not expected in the near future on the basis of this concept. A further concept for producing white light sources is based on the monolithic integration of a plurality of semiconductor layers and corresponding pn junctions on a substrate, the semiconductor materials being composed such that light having different wavelengths is generated in the pn junctions through current injection. U.S. Pat. No. 6,163,038 describes such a white light source based on the GaN material system. Two embodiments describe components in which a semiconductor layer sequence with three pn junctions is produced, which emit light having wavelengths of the complementary colors red, green and blue, thereby bringing about the optical effect of a white light source. This concept has the advantage that, in principle, polychromatic light of any desired color can be generated, thus resulting in a multiplicity of applications in the area of display and illumination devices. However, even with components of this type, it will not be possible to produce large-area illumination devices having a high luminous intensity with a tenable outlay in respect of costs.

A further concept for white light sources is based on organic light-emitting diodes (OLED), which have developed rapidly in recent times and are already used commercially in display devices of motor vehicles. Organic light-emitting diodes can generate white light relatively simply, since, by virtue of the great diversity of organic substances, different emitters can be brought together in order to generate white light. The published German patent application DE 199 16 745 A1 describes a light-emitting diode with organic light-emitting substances for generating light with mixed colors, in which a layer containing organic light-emitting substances is arranged between two electrode layers and two substrate carriers, in which case one of the carriers may be formed by a diffusing screen. The organic light emitter layer has a strip structure in which at least two types of strips are arranged alternately and strips of one type in each case having organic light-emitting substances which emit light of a specific color, strips of one type being driven jointly. The organic light-emitting substances of the two or three strip types are chosen such that, given suitable driving, the mixing of the radiated light of the strips produces white light. However, one disadvantage of the component described in the embodiment is that the width of the strips of the light emitter layers is so small that the strip structure can no longer be resolved upon normal observation by the human eye, as a result of which the production of the component becomes relatively complicated.

SUMMARY OF THE INVENTION

Accordingly, it is an object of the present invention to specify an electroluminescent light emission device with which visible light of varying wavelength can be generated and additively mixed and which can be produced cost-effectively. The electroluminescent light emission device is intended to be able to be used, in particular, as a white light source.

This object is achieved by means of the characterizing features of patent claim 1. Advantageous developments and refinements are specified in the subclaims.

The present invention proceeds from a light emission device as has been described in the document DE 199 16 745 already mentioned and in which the light emitter layers are arranged in the form of a strip structure alternately laterally next to one another between the electrode layers.

The present invention is based on the essential insight that it is not absolutely necessary to provide microscopic structuring of the strip structure for the additive color mixing of the radiation beams emitted by the light emitter strips. Rather, it is an essential feature of the present invention that the lateral extent and/or the lateral distance of the light emitter layers from one another is of an order of magnitude such that it can be resolved by the human eye merely upon observation. For the color mixing of the radiation beams emitted by the light emitter layers, it is then necessary that the thickness of the substrate formed as a diffusing screen is chosen such that the radiation beams emitted by the light emitter layers are at least partly superposed on the light exit surface of the substrate. Thus, the substrate must have a thickness at least such that the individual radiation beams to be mixed experience a sufficient scattering widening when passing through the substrate.

Consequently, there is no need for any complicated masking and structuring steps, such as are known for instance from microelectronics, in order to produce an electroluminescent light emission device according to the invention. It is possible to provide macroscopic lateral extents of the light emitter layers, which can be produced by simple structuring measures.

A standard value which is known from the resolution of the human eye is 1 angular minute=1/60 degree. Given a viewing distance of 1 m from the light emitter layers, this corresponds to 0.29 mm. If a viewing distance of 30 cm is assumed, a resolution of 35 approximately 100 μm results. Consequently, a value of approximately 100 gm for the lateral distance and/or the width of strip-type light emitter layers can be assumed as an expedient lower limit for lateral dimensions of the light emitter layers that can still be resolved by the human eye. With regard to the thickness of the substrate formed as a diffusing screen, this should be greater, preferably significantly greater, than the average scattering length for the radiation beams emitted by the light emitter layers in the diffusing screen. In a somewhat simplified definition, the scattering length may be understood here to be the average free path length covered by a photon having a given frequency before it changes its direction as a result of scattering. A diffusing screen having relatively strongly scattering properties thus has a correspondingly short average scattering length, so that the thickness of the diffusing screen can be dimensioned to be correspondingly smaller than in the case of a diffusing screen having less strongly scattering properties. In order to attain a sufficient superposition of the different radiation beams, the distance between the light emitter layers should furthermore play a part for the thickness of the diffusing screen. Preferably, in addition to the criterion mentioned above, the thickness of the diffusing screen should be chosen to be at least approximately as large as the distance between the light emitter layers.

In this case, the light emitter layers are preferably produced from organic materials in a manner known per se. As was shown experimentally only recently, organic materials suitable for this may be deposited in such a way that charge carriers can enter into the organic layers through two electron- or hole-injecting electrodes and an organic light-emitting diode (OLED) is thus formed.

Two or more different types of light emitter layers having different emission spectra are provided, the mixing of which enables white light to be generated. It may be provided that two unstructured electrode layers extend on both sides of the light emitter layers, so that the light emitter layers are always driven jointly. In this case, however it is not possible to take account of the fact that the different organic materials of the light emitter layers are subjected to different aging times, so that the optical impression of a white light source is lost over the course of time, since one of the light emitter layers loses its luminosity more rapidly than the others.

Therefore, an advantageous embodiment provides for a plurality of electrodes to be arranged on one side of the light emitter layers in such a way that light emitter layers with a different emission spectrum can be driven separately from one another and those with an identical emission spectrum can be driven jointly. Consequently, in use, the possibly decreased luminosity of one type of light emitter layers can be correspondingly compensated for by application of an increased voltage. Irrespective of this problem area of different aging times of the organic materials, this embodiment can be used to control as individually desired the coloration of an illumination device formed by the white light source, i.e., by way of example, to emphasize the red or the blue color component more strongly or more weakly within the white light spectrum.

In a simple embodiment which can be used for a small-format white light LED, for example, it may be provided that the emission spectra provided for the light mixing are represented only by one light emitter layer in each case. However, embodiments are also conceivable, in particular for large-area illumination devices, in which the emission spectra are represented by a plurality of light emitter layers in each case. If the light emitter layers are structured in strip form, then it is possible, in this case, for the light emitter layers to be arranged in an alternate order according to their emission spectrum.

However it is not a necessary constituent part of the invention that the light emitter layers are structured in strip form. Rather, the light emitter layers may also be arranged as punctiform or circular-disk-type layers laterally next to one another. Particularly if the light emitter layers are formed by red, green and blue emitting light emitter layers in their emission spectra, the light emitter layers may be arranged in the form of a color triad comprising three circular-point-type light emitter layers, that is known per se from color display screen technology. In the case of such an embodiment, with regard to the criterion of resolvability by the human eye, a value of approximately 100 gm may likewise be assumed as the lower limit for the diameter of the circular layers and/or for the mutual distance between their center points.

An advantageous embodiment provides three types of light emitter layers, the essentially monochromatic emission spectra of which respectively have maxima in the red, green and blue wavelength ranges. The mixing of the three complementary colors generates white light if they are emitted with the same luminous intensity by the light emitter layers.

However, it may also be provided that only two types of light emitter layers are used, the emission spectra of which respectively have maxima in the yellow and blue wavelength ranges, it being necessary to set the yellow light emitter layer with a higher luminosity.

It is also conceivable to use more than three types of light emitter layers having different emission spectra, for instance in order to enable the white light spectrum to be adapted as optimally as possible to daylight.

BRIEF DESCRIPTION OF THE DRAWINGS

An embodiment of the light emission device according to the invention is explained in more detail below with reference to the figures, in which.

DETAILED DESCRIPTION OF THE INVENTION

Figure 1:
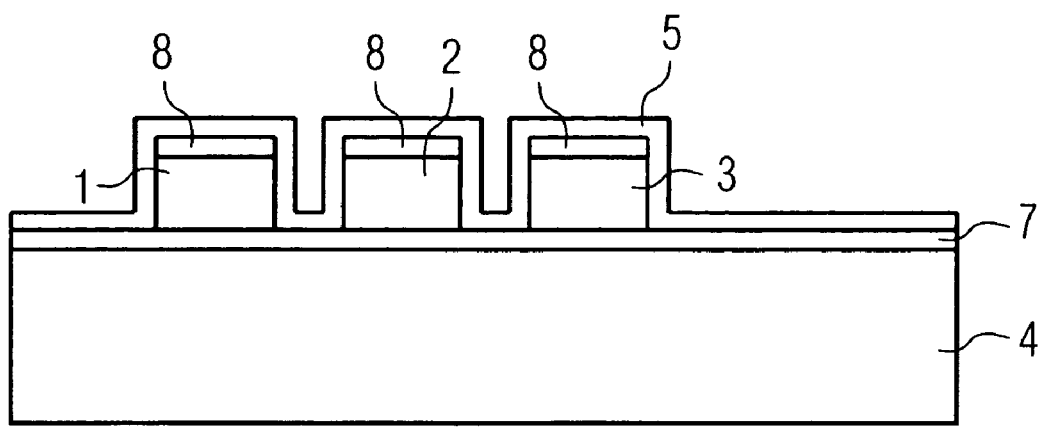
FIG. 1 shows a side or sectional view of a white light source according to the invention.
Figure 2:
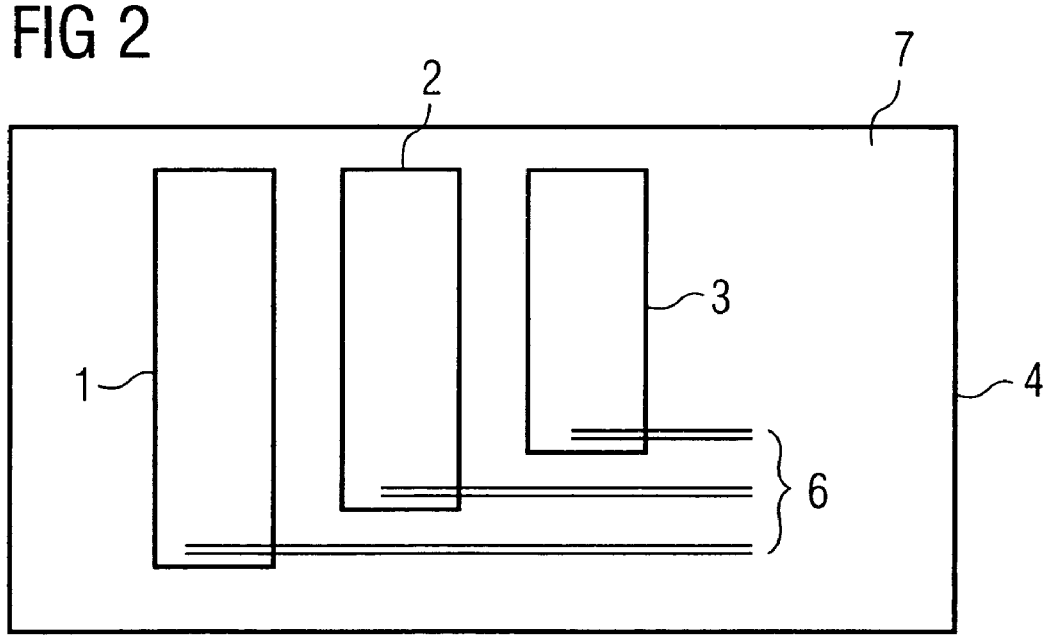
FIG. 2 shows a plan view of the white light source of FIG. 1.

The figures illustrate an embodiment comprising three varicolored-emitting light emitter layers. The light emitter layers are formed by organic LEDs.

A first transparent electrode layer 7 is applied on a light-scattering substrate 4, which may be formed for example by an opal glass screen or a plastic substrate with embedded scattering centers The electrode layer 7 may be formed for example by an ITO (indium tin oxide) layer.

Afterward, light emitter layers 1, 2 and 3 are successively applied in strip form to the first electrode layer 7. The light emitter layers 1, 2 and 3 in each case comprise a layer sequence made of n- and p-doped organic materials, so that a pn junction is formed within the layer sequence. The organic materials are chosen such that the first light emitter layer 1 has an emission maximum at a wavelength in the red spectral range, the second light emitter layer 2 has an emission maximum at a wavelength in the green spectral range, and the third light emitter layer 3 has an emission maximum at a wavelength in the blue spectral range.

The strip-type light emitter layers 1, 2 and 3 can be perceived by the naked eye on the substrate 4 and for example have a strip width of about 1 mm.

The radiation beam emitted by the first light emitter layer 1 is illustrated by way of example. It is important for the color mixing and the generation of white light that the average lateral scattering widening of the emitted light is significantly greater than the width of the strip-type light emitter layers. It is only if a sufficient superposition of the radiation beams emitted by the light emitter layers 1, 2 and 3 occurs on the light exit surface of the substrate 4, opposite to the light emitter layers, that the light emission device, in use, is perceived as a white light source by an observer.

Electrode layers 8 are in each case applied on the rear surfaces of the strip-type light emitter layers 1, 2 and 3. Finally, a reflective layer 5 is applied to the entire structure, and ensures that the light emitted in the rearward direction by the pn junctions of the light emitter layers 1, 2 and 3 is reflected forward in the direction of the substrate 4. The reflective layer 5 may be embodied as a metallic or else dielectric layer. Afterward, lead wires 6 (not illustrated in FIG. 1) may be laid to each of the three OLEDs and be connected in each case to the electrode layers 8. Via the lead wires 6, it is possible to apply to the OLEDs different voltages from voltage sources, the common opposite pole of which is connected to the first electrode layer 7.

In the exemplary embodiment shown, each emission type is represented only by one light emitter layer. For the case where a higher luminous intensity and/or a larger illumination area is desired, it is possible to apply further strips of light emitter layers in an alternate order of their spectral type.

The invention claimed is:

1. An electroluminescent light emission device suitable for use as a white light source, comprising:
   a transparent substrate formed as a diffusing screen;
   at least one first transparent electrode layer applied to the substrate;
   a plurality of electroluminescent light emitter layers arranged laterally next to one another on the at least first transparent electrode layer and from whose emission radiation white light can be generated by additive color mixing;
   at least one second electrode layer applied to the plurality of light emitter layers;
   the lateral extent and/or a lateral distance of the light emitter layers amounting to at least 100 µm; and
   the diffusing screen being an opal glass screen or a plastic substrate with embedded scattering centers and its thickness being a multiple of the average scattering length of the radiation beams to be mixed of the light emitter layers and being at least as large as the distance between the light emitter layers, whereby
   the radiation beams emitted by the light emitter layers are at least partly superposed on a light exit surface of the substrate.

2. The electroluminescent light emission device as claimed in claim 1, wherein
   the light emitter layers are produced from organic materials.

3. The electroluminescent light emission device as claimed in claim 1 or 2, wherein
   a plurality of first and/or second electrodes are arranged in such a way that light emitter layers with a different emission spectrum can be driven separately from one another and those with an identical emission spectrum can be driven jointly.

4. The electroluminescent light emission device as claimed in one of claims 1 to 2, wherein
   the emission spectra provided are represented only by in each case one light emitter layer.

5. The electroluminescent light emission device as claimed in one of claims 1 to 2, wherein
   the emission spectra are provided by in each case a plurality of light emitter layers.

6. The electroluminescent light emission device as claimed in one of claims 1 to 2, wherein
   the light emitter layers are in strip form and are arranged parallel to one another.

7. The electroluminescent light emission device as claimed in claim 5, wherein
   the light emitter layers are arranged in an alternate order according to their emission spectrum.

8. The electroluminescent light emission device as claimed in one of claims 1 to 2, wherein
   three types of light emitter layers respectively have the emission spectra of maxima in red, green and blue wavelength ranges.

9. The electroluminescent light emission device as claimed in one of claims 1 to 2, wherein
   two types of light emitter layers respectively have the emission spectra of maxima in yellow and blue wavelength ranges.

10. The electroluminescent light emission device as claimed in one of claims 1 to 2, wherein
    the light emitter layers are provided with a reflective layer on their surface remote from the substrate.

11. The electroluminescent light emission device as claimed in claim 10, wherein
    the second electrode layer simultaneously serves as the reflective layer.

12. The electroluminescent light emission device as claimed in one of claims 1 to 2, wherein
    the first electrode layer is an ITO layer applied to the substrate.

* * * * *